(12) United States Patent
Park et al.

(10) Patent No.: US 8,835,956 B2
(45) Date of Patent: Sep. 16, 2014

(54) DISPLAY SUBSTRATE AND METHOD OF MANUFACTURING THE SAME

(75) Inventors: Zin-Taek Park, Seoul (KR); Hyeong-Chan Ko, Seoul (KR); Hyun Park, Cheonan-si (KR); Byeong-Yun Nam, Asan-si (KR); Sang-Hoon Lee, Daejeon (KR); Sung-Hoon Kim, Seoul (KR)

(73) Assignee: Samsung Display Co., Ltd. (KR)

( * ) Notice: Subject to any disclaimer, the term of this patent is extended or adjusted under 35 U.S.C. 154(b) by 171 days.

(21) Appl. No.: 13/287,153

(22) Filed: Nov. 2, 2011

(65) Prior Publication Data
US 2012/0146085 A1    Jun. 14, 2012

(30) Foreign Application Priority Data
Dec. 13, 2010 (KR) .................. 10-2010-0126697

(51) Int. Cl.
*H01L 33/00* (2010.01)
*G02F 1/1345* (2006.01)
*H01L 27/12* (2006.01)

(52) U.S. Cl.
CPC .......... *H01L 27/124* (2013.01); *G02F 1/13458* (2013.01); *H01L 27/1288* (2013.01)
USPC ..................... 257/98; 257/E27.121

(58) Field of Classification Search
USPC .......................................... 257/E27.121, 98
See application file for complete search history.

*Primary Examiner* — Amar Movva
(74) *Attorney, Agent, or Firm* — Cantor Colburn LLP

(57) ABSTRACT

A display substrate includes a substrate, a pixel part, a pad part and a sacrificial electrode. The substrate includes a display area and a peripheral area. The pixel part is on the display area and includes a switching element, and a pixel electrode electrically connected to the switching element. The pad part is on the peripheral area and contacts a terminal of an external device. The pad part includes a pad electrode a contact electrode. The pad electrode includes a first metal layer, and a second metal layer on the first metal layer, and the contact electrode contacts the second metal layer. The sacrificial electrode is spaced apart from the pad electrode and contacts the contact electrode. An exposed portion of the sacrificial electrode is exposed to an external side of the display substrate.

15 Claims, 15 Drawing Sheets

DISPLAY SUBSTRATE AND METHOD OF MANUFACTURING THE SAME

This application claims priority to Korean Patent Application No. 2010-0126697, filed on Dec. 13, 2010, and all the benefits accruing therefrom under 35 U.S.C. §119, the contents of which are herein incorporated by reference in their entirety.

BACKGROUND OF THE INVENTION

1. Field of the Invention

Exemplary embodiments of the invention relate to a display substrate and a method of manufacturing the display substrate. More particularly, exemplary embodiments of the invention relate to a display substrate having corrosion resistance and a method of manufacturing the display substrate.

2. Description of the Related Art

Generally, a display device includes a display panel displaying an image, a driving part driving the display panel and electrically connected to the display panel, and a light providing assembly providing the display panel with lights. The display panel includes a first substrate on which a plurality of pixels including a switching element and a pixel electrode are formed, a second substrate facing the first substrate, and a liquid crystal layer interposed between the first substrate and the second substrate. The display panel applies a voltage to the liquid crystal layer to control a light transmittance provided from the light providing assembly, so that the image may be displayed thereon.

The driving part may be configured by directly forming a drive circuit on the first substrate or by electrically connecting an external device including an integrated driving circuit to the first substrate. The external device includes terminals connected to driving circuits, and the terminals make contact with a pad part formed on the first substrate of the display panel, so that the external device may be electrically connected to the display panel.

In the first substrate, an area on which the pixels are formed faces the second substrate to receive a liquid crystal layer in a vacuum state, so that the display panel may be protected from an external pollution and an oxidation. However, the pad part on the first substrate is exposed to an external side until the pad part is coupled with the external device, so that the pad part may be easily corroded. When the pad part is corroded, an oxidation reaction of a metal is infiltrated to an inner portion of the display panel to affect the pixels. A corrosion of the pad part is a major factor for decreasing a display quality of the display panel. Particularly, when a time required for coupling the external device with the display panel is increased, a time the pad part is left exposed is increased so that a corrosion possibility of the pad part may be increased.

BRIEF SUMMARY OF THE INVENTION

Exemplary embodiments of the invention provide a display substrate having an enhanced reliability by restraining a corrosion of a pad part.

Exemplary embodiments of the invention also provide a method of manufacturing the above-mentioned display substrate.

According to an exemplary embodiment of the invention, a display substrate includes a substrate, a pixel part, a pad part and a sacrificial electrode. The substrate includes a display area and a peripheral area. The pixel part is on the display area, and includes a switching element, and a pixel electrode electrically connected to the switching element. The pad part is on the peripheral area and contacts a terminal of an external device. The pad part includes a pad electrode and a contact electrode. The pad electrode includes a first metal layer, and a second metal layer on the first metal layer, and the contact electrode contacts the second metal layer. The sacrificial electrode is spaced apart from the pad electrode and contacts the contact electrode. A portion of the sacrificial electrode is exposed to an external side of the display substrate.

In an exemplary embodiment, the contact electrode may include a same material as the pixel electrode.

In an exemplary embodiment, a standard reduction potential of the sacrificial electrode may be lower than that of the contact electrode.

In an exemplary embodiment, the exposed portion of the sacrificial electrode may include the first metal layer contacting the contact electrode. In this case, the first metal layer may include aluminum (Al), the second metal layer may include molybdenum (Mo), and the contact electrode may include a same material as the pixel electrode. The contact electrode may include indium (In). Alternatively, the first metal layer may include titanium (Ti), and the second metal layer may include copper (Cu).

In an exemplary embodiment, the exposed portion of the sacrificial electrode may include a third metal layer different from the first and second metal layers, the third metal layer contacting the contact electrode. In this case, the display substrate further includes a second signal line crossing a first signal line extended from the pad electrode, and the second signal line may include the third metal layer. Here, the first metal layer may include titanium (Ti), the second metal layer may include copper (Cu), and the third metal layer may include aluminum (Al).

In an exemplary embodiment, the display substrate may further include the pad electrode and the sacrificial electrode on a substrate, and an insulation layer on the substrate and including an opening portion partially exposing the sacrificial electrode. In this case, the contact electrode may contact the sacrificial electrode through the opening portion, and the exposed portion of the sacrificial electrode may be exposed through the opening portion of the insulation layer.

In an exemplary embodiment, the display substrate may further include a signal line connected to a gate electrode of the switching element on the display area, and the pad electrode on the peripheral area may be extended from a first terminal of the signal line. Alternatively, the display substrate may further include a signal line connected to a source electrode of the switching element on the display area, and the pad electrode on the peripheral area may be extended from a first terminal of the signal line.

In an exemplary embodiment, the display substrate may further include a gate drive circuit on the peripheral area, adjacent to first terminals of signal lines on the display area, the gate drive circuit sequentially outputting a plurality of gate signals. In this case, the display substrate may further include a driving line delivering a control signal to the gate drive circuit, and the pad electrode may be extended from a first terminal of a driving line. The driving line may be a clock signal line delivering a clock signal to the gate drive circuit.

According to another exemplary embodiment of the invention, there is provided a method of manufacturing a display substrate. In the method, a signal line, a pad electrode connected to an end terminal of the signal line, and a preliminary electrode spaced apart from the pad electrode are formed on a substrate. The signal line, the pad electrode and the preliminary electrode each include a first metal layer, and a second metal layer sequentially formed on the substrate. A sacrificial electrode is formed by removing the second metal layer. A pixel electrode is formed on a display area of the substrate, and a contact electrode is formed on a peripheral area of the display area. The contact electrode makes contact with the pad electrode and makes partial contact with the sacrificial electrode.

In an exemplary embodiment, the signal line and the pad electrode may be formed by patterning the first and second metal layers when the preliminary electrode is formed.

In an exemplary embodiment, when the preliminary electrode is formed, a photo pattern including a first thickness portion and a second thickness portion smaller than the first thickness portion may be formed. Here, the first thickness portion is formed on an area corresponding to the signal line and the pad electrode, and the second thickness portion is formed on an area corresponding to the preliminary electrode. Then, the first and second metal layers may be etched using the photo pattern as an etch stop layer. In this case, a remaining pattern may be further formed by removing the second thickness portion before the sacrificial electrode is formed. Here, the sacrificial electrode may be formed by removing the second metal layer of the preliminary electrode exposed through the remaining pattern.

In an exemplary embodiment, when the preliminary electrode is formed, the signal line and the pad electrode may be formed by patterning a third metal layer different from the first and second metal layers formed on the substrate. Then, the preliminary electrode may be formed by patterning the first and second metal layers formed on the substrate.

In an exemplary embodiment, the signal line may include a gate line, and the first and second metal layers may be formed on the substrate on which the gate line is formed. A data line including the first and second metal layers to cross the gate line may be formed when the preliminary electrode is formed.

In an exemplary embodiment, the signal line may include a data line, and the third metal layer may be formed on the substrate on which the data line is formed. A gate line including the first and second metal layers to cross the data line may be formed when the preliminary electrode is formed.

According to exemplary embodiments of a display substrate and a method of manufacturing the display substrate, a sacrificial electrode includes a metal relatively easily oxidized compared to a metal of a pad part at a peripheral area of a substrate, so that an oxidation of the pad part may be minimized even though the peripheral area is exposed to an external side. Thus, the sacrificial electrode including the metal relatively easily oxidized compared to the metal of the pad part may reduce or effectively prevent corrosion of the pad part.

Moreover, the sacrificial electrode may be formed by using one mask in a process for forming pad electrode of the pad part without an additional process, so that increase of a manufacturing cost or a number of manufacturing processes for a display substrate may be reduced or effectively.

BRIEF DESCRIPTION OF THE DRAWINGS

The above and other features and advantages of the invention will become more apparent by describing in detailed exemplary embodiments thereof with reference to the accompanying drawings, in which.

DETAILED DESCRIPTION OF THE INVENTION

Figure 1:
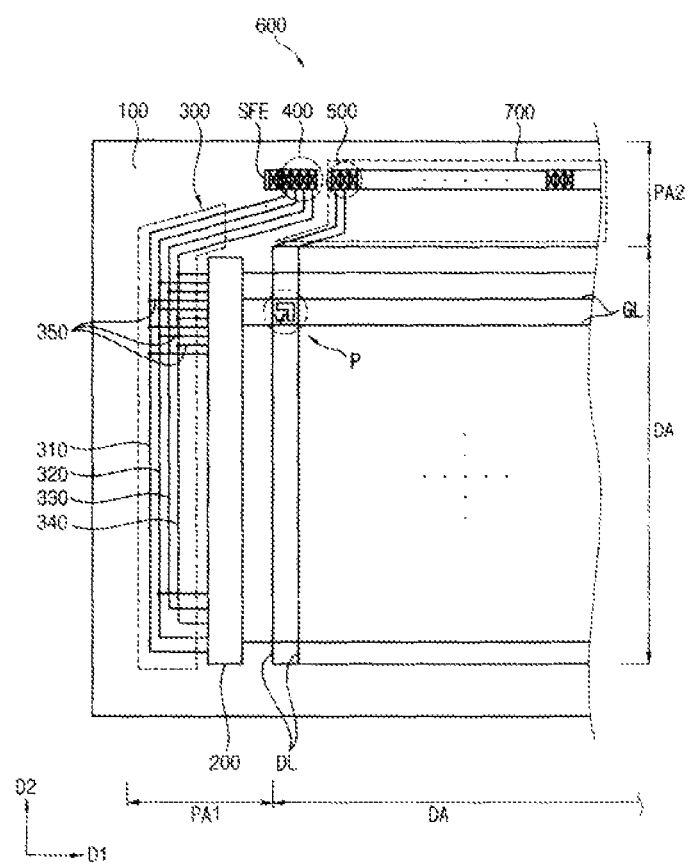
FIG. 1 is a plan view illustrating an exemplary embodiment of a display substrate according to the invention.

The invention is described more fully hereinafter with reference to the accompanying drawings, in which exemplary embodiments of the invention are shown. This invention may, however, be embodied in many different forms and should not be construed as limited to the exemplary embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on," "connected to" or "coupled to" another element or layer, the element or layer can be directly on, connected or coupled to another element or layer or intervening elements or layers. In contrast, when an element is referred to as being "directly on," "directly connected to" or "directly coupled to" another element or layer, there are no intervening elements or layers present. As used herein, connected may refer to elements being physically and/or electrically connected to each other. Like numbers refer to like elements throughout. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the invention.

Spatially relative terms, such as "below," "lower," "upper" and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "below" or "lower" relative to other elements or features would then be oriented "above: or "upper" relative to the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

All methods described herein can be performed in a suitable order unless otherwise indicated herein or otherwise clearly contradicted by context. The use of any and all examples, or exemplary language (e.g., "such as"), is intended merely to better illustrate the invention and does not pose a limitation on the scope of the invention unless otherwise claimed. No language in the specification should be construed as indicating any non-claimed element as essential to the practice of the invention as used herein.

Hereinafter, the invention will be explained in detail with reference to the accompanying drawings.

FIG. 1 is a plan view illustrating an exemplary embodiment of a display substrate according to the invention.

Figure 2:
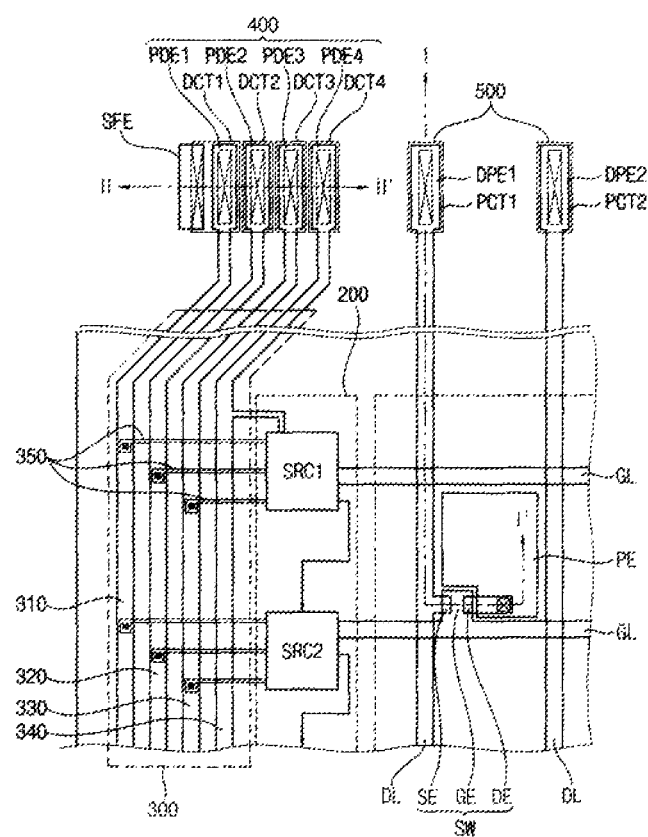
FIG. 2 is a partially enlarged plan view of the display substrate shown in FIG. 1.

FIG. 2 is a partially enlarged plan view of the display substrate shown in FIG. 1.

Referring to FIGS. 1 and 2, a display substrate 600 includes a base substrate 100, a gate line GL, a data line DL, a pixel part P, a gate drive circuit 200, a driving line part 300, a driving pad part 400, a sacrificial electrode SFE and a data pad part 500.

A driving chip 700 in which a data drive circuit is integrated is coupled to the data pad part 500, so that the display substrate 600 may be electrically connected to the driving chip 700. In an exemplary embodiment, the display substrate 600 may include a plurality of gate lines G1, a plurality of data lines DL and/or a plurality of pixel parts P.

The gate line GL, the data line DL and the pixel part P are on a display area DA of the base substrate 100. The gate line GL and the data line DL apply signals to the pixel part P. The gate line GL and the data line DL may be different from the driving line part 300. The gate line GL is longitudinally extended in a first direction D1, and the data line DL is longitudinally extended in a second direction D2 different from the first direction D1. The first direction D1 may be substantially perpendicular to the second direction D2. The pixel part P includes a switching element SW electrically connected to the gate line GL and the data line DL, and a pixel electrode PE electrically connected to the switching element SW.

The gate drive circuit 200 is on a first peripheral area PA1 extended along the first direction D1 from the display area DA. An end portion of the gate line GL may be extended from the display area DA to the gate drive circuit 200 in the first peripheral area PA1, such that the gate drive circuit 200 is electrically connected to the gate line GL. The gate drive circuit 200 may include plural stages SRC1 and SRC2 that are connected one after another to each other. The stages SRC1 and SRC2 may be arranged along the second direction D2. Each of the stages SRC1 and SRC2 may be connected to one gate line GL of a plurality of gate lines GL, respectively. In one exemplary embodiment, the gate drive circuit 200 is formed on the first peripheral area PA1 in a process for forming the gate line GL, the data line DL and the switching element SW, so that the gate drive circuit 200 may be directly integrated on the base substrate 100.

The driving line part 300 is on the first peripheral area PA1 and adjacent to the gate drive circuit 200, and is electrically connected to the gate drive circuit 200. The gate drive circuit 200 may be disposed between the line driving part 300 and the display area DA. The driving line part 300 includes a plurality of driving lines 310, 320, 330 and 340 and delivers a driving signal and a control signal that are provided from an external device (not shown), to the gate drive circuit 200. In one exemplary embodiment, for example, the driving line part 300 may include a first driving line 310 that is a first clock line, a second driving line 320 that is a second clock line, a third driving line 330 that is a power line and a fourth driving line 340 that is a start line delivering a vertical start signal. Each of the first to third driving lines 310, 320 and 330 may be respectively electrically connected to the stages SRC1 and SRC2 through plural connection lines 350. The fourth driving line 340 is directly electrically connected to a first stage SRC1. In this exemplary embodiment, it is described that the driving line part 300 includes two clock lines. Alternatively, the number of the clock lines may be no less than four.

The driving pad part 400 is on a second peripheral area PA2 extended along the second direction D2 from the display area DA. The driving pad part 400 is extended from end portions of the first to fourth driving lines 310, 320, 330 and 340 in the first peripheral area PA1 to the second peripheral area PA2, so that the driving pad part 400 is electrically and physically connected to the driving line part 300. The driving signal and/or the control signal that are provided from an external device (not shown) may be delivered to the display substrate 600 through the driving pad part 400. The driving pad part 400 includes plural driving pad electrodes PDE1, PDE2, PDE3 and PDE4, plural driving contact electrodes DCT1, DCT2, DCT3 and DCT4 respectively connected to the driving pad electrodes PDE1, PDE2, PDE3 and PDE4, and the sacrificial electrode SFE electrically and/or physically connected to at least one of the driving pad electrodes PDE1, PDE2, PDE3 and PDE4. The driving pad electrodes PDE1, PDE2, PDE3 and PDE4 as respectively extending from the first to fourth driving lines 310, 320, 330 and 340 may be continuous with each other, respectively, so as to form first to fourth single, unitary, indivisible members.

In one exemplary embodiment, the driving pad part 400 may include a first driving pad electrode PDE1 connected to the first driving line 310, a second driving pad electrode PDE2 connected to the second driving line 320, a third driving pad electrode PDE3 connected to the third driving line 330, a fourth driving pad electrode PDE4 connected to the fourth driving line 340, a first driving contact electrode DCT1, a second driving contact electrode DCT2, a third driving contact electrode DCT3 and a fourth driving contact electrode DCT4. The first to fourth driving contact electrodes DCT1, DCT2, DCT3 and DCT4 are electrically connected to the first to fourth driving pad electrodes PDE1, PDE2, PDE3 and PDE4, respectively. The first to fourth driving contact electrodes DCT1, DCT2, DCT3 and DCT4 may include a same material as the pixel electrode PE.

The sacrificial electrode SFE may be on the second peripheral area PA2 and adjacent to the driving pad part 400. The sacrificial electrode SFE is electrically connected to one of the first to fourth driving pad electrodes PDE1, PDE2, PDE3 and PDE4. In one exemplary embodiment, for example, the sacrificial electrode SFE may be electrically connected to the first driving pad electrode PDE1. The sacrificial electrode SFE is electrically connected to the first driving pad electrode PDE1 through the first driving contact electrode DCT1.

The sacrificial electrode SFE may have a shape similar to that of the first to fourth driving pad electrodes PDE1, PDE2, PDE3 and PDE4. In one exemplary embodiment, for example, the first driving pad electrode PDE1 has a bar shape in the plan view, having a long side along the second direction D2 and a short side along the first direction D1. The sacrificial electrode SFE may have a same shape as that of the first driving pad electrode PDE1 and be parallel with the first driving pad electrode PDE1. A size (e.g., dimension) of the sacrificial electrode SFE may be substantially the same as that of the first driving pad electrode PDE1. The sacrificial electrode SFE may have the same shape and dimension as that of the first to fourth driving pad electrodes PDE1, PDE2, PDE3 and PDE4 in the plan view and/or a cross-sectional view.

In FIGS. 1 and 2, the sacrificial electrode SFE is connected to the first driving line 310 that is a clock signal wiring in which a high voltage is applied thereto, so that an oxidation reaction is easily generated with respect to other driving lines 320, 330 and 340. Alternatively, the display substrate 600 may further include three sacrificial electrodes connected to the second, three and fourth driving pad electrodes PDE2, PDE3 and PDE4, respectively. In this case, four sacrificial electrodes SFE respectively connected to the first to fourth driving pad electrodes PDE1, PDE2, PDE3 and PDE4 are spaced apart from each other, so that the four sacrificial electrodes SFE are electrically disconnected to each other.

The sacrificial electrode SFE, the first driving pad electrode PDE1 and the first driving contact electrode DCT1 will be explained in detail with reference to FIGS. 3A, 3B and 4.

The data pad part 500 is on the second peripheral area PA2. End portions of the data line DL are extended from the display area DA to the data pad part 500 in the second peripheral area PA2, such that the data line DL is electrically connected to the data pad part 500. The data pad part 500 includes a first data pad electrode DPE1, a second data pad electrode DPE2, a first data contact electrode PCT1 electrically connected to the first data pad electrode DPE1, and a second data contact electrode PCT2 electrically connected to the second data pad electrode DPE2. The first data pad electrode DPE1 and the second data pad electrode DPE2 are connected to an end portion of the different data lines DL. The first data pad electrode DPE1 and the second data pad electrode DPE2 as extending from a data line may be continuous with each other, respectively, so as to form single, unitary, indivisible members.

Figure 3A:
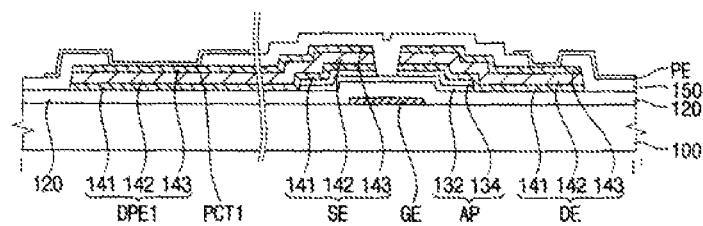
FIG. 3A is a cross-sectional view taken along line I-I' of FIG. 2.

FIG. 3A is a cross-sectional view taken along line I-I' of FIG. 2.

Figure 3B:
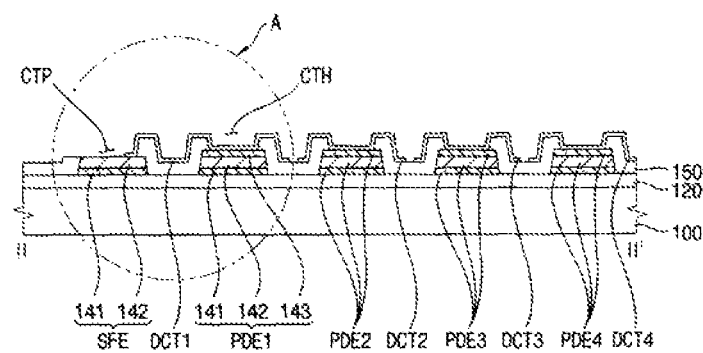
FIG. 3B is a cross-sectional view taken along line II-II' of FIG. 2.

FIG. 3B is a cross-sectional view taken along line II-II' of FIG. 2.

Referring to FIGS. 2, 3A and 3B, the switching element SW includes a gate electrode GE, an active pattern AP overlapping the gate electrode GE, a source electrode overlapping a first end portion of the active pattern AP, and a drain electrode DE overlapping a second end portion of the active pattern AP opposite to the first end portion. The drain electrode DE partially makes contact with the pixel electrode PE, so that the switching element SW may be electrically connected to the pixel electrode PE.

The gate electrode GE is connected to the gate line GL to have a layer structure that is identical to that of the gate line GL. The gate electrode GE may be continuous with the gate line GL, such that a single, unitary, indivisible element is defined. The source electrode SE is connected to the data line DL, and the drain electrode DE is spaced apart from the source electrode SE. The source electrode SE may be continuous with the data line DL, such that a single, unitary, indivisible element is defined. Each of the source electrode SE and the drain electrode DE has a layer structure that is identical to that of the data line DL. The active pattern AP may include a semiconductor layer 132 and an ohmic contact layer 134.

The display substrate 600 may further include a first insulation layer 120 and a second insulation layer 150. The first insulation layer 120 is between the gate electrode GE and the active pattern AP, and insulates the gate line GL and the data line DL. The first and second data pad electrodes DPE1 and DPE2, the source electrode SE, the drain electrode DE and the first to fourth driving pad electrodes PDE1, PDE2, PDE3 and PDE4 may be on the first insulation layer 120.

The first insulation layer 120 overlaps the first and second data pad electrodes DPE1 and DPE2, the source electrode SE, the drain electrode DE and the first to fourth driving pad electrodes PDE1, PDE2, PDE3 and PDE4. The second insulation layer 150 may have a contact hole CTH partially exposing the first to fourth driving pad electrodes PDE1, PDE2, PDE3 and PDE4, respectively, and an opening portion CTP partially exposing the sacrificial electrode SFE. In one exemplary embodiment, the opening portion CTP may fully expose a first end portion extended along the second direction D2 of the sacrificial electrode SFE. The contact hole CTH and the opening portion CTP are areas where material of the second insulation layer 150 does not exist, and may be extended completely through a thickness of the second insulation layer 150.

Each of the first to fourth driving pad electrodes PDE1, PDE2, PDE3 and PDE4 may partially make contact with the first to fourth driving contact electrodes DCT1, DCT2, DCT3 and DCT4 through the contact hole CTH. Each of the first to fourth driving contact electrodes DCT1, DCT2, DCT3 and DCT4 may fully cover (e.g., overlap) the first to fourth driving pad electrodes PDE1, PDE2, PDE3 and PDE4 exposed through the contact hole CTH. Thus, the first to fourth driving pad electrodes PDE1, PDE2, PDE3 and PDE4 may be not exposed to an external side or area of the display substrate 600.

A portion of the sacrificial electrode SFE is exposed through the opening portion CTP of the second insulation layer 150. The portion of the sacrificial electrode SFE exposed through the opening portion CTP makes partial contact with the first driving contact electrode DCT1, so that a portion of the sacrificial electrode SFE is exposed to the external side. That is, the portion of the sacrificial electrode SFE exposed to the external side may make contact with air, moisture, foreign substance, etc. of the external side.

In a layer structure, each of the first and second data pad electrodes DPE1 and DPE2, the source electrode SE and the drain electrode DE includes a first data metal layer 141, a second data metal layer 142 and a third data metal layer 143. Moreover, each of the first to fourth driving pad electrodes PDE1, PDE2, PDE3 and PDE4 includes the first to third data metal layers 141, 142 and 143. Each uppermost metal layer of the first and second data pad electrodes DPE1 and DPE2, the source electrode SE and the drain electrode DE is the third data metal layer 143. The sacrificial electrode SFE includes the first data metal layer 141 and the second data metal layer 142. An uppermost layer of the sacrificial electrode SFE is the second data metal layer 142.

A standard reduction potential of a first metal of the second data metal layer 142 is lower than that of a second metal of the third data metal layer 143. That is, an oxidation property of the first metal may be greater than that of the second metal layer.

In one exemplary embodiment, for example, the first data metal layer 141 includes molybdenum (Mo), the second metal layer 142 includes aluminum (Al), and the third data metal layer 143 includes molybdenum (Mo). A standard reduction potential of aluminum (Al) is about −1.66 volts (V), a standard reduction potential of indium (In) is about −0.338 V, and a standard reduction potential of a molybdenum dioxide ($MoO_2$) is about −0.15 V.

The pixel electrode PE, the first and second data contact electrodes PCT1 and PCT2, and the first to fourth driving contact electrodes DCT1, DCT2, DCT3 and DCT4 may include a third metal having a standard reduction potential relatively higher than the second metal of the third data metal layer 143. In one exemplary embodiment, for example, the third metal may include indium (In) having a standard reduction potential higher than that of aluminum (Al). The pixel electrode PE, the first and second data contact electrodes PCT1 and PCT2, and the first to fourth driving contact electrodes DCT1, DCT2, DCT3 and DCT4 may respectively include an indium zinc oxide ("IZO"), an indium tin oxide ("ITO"), and the like.

Figure 4:
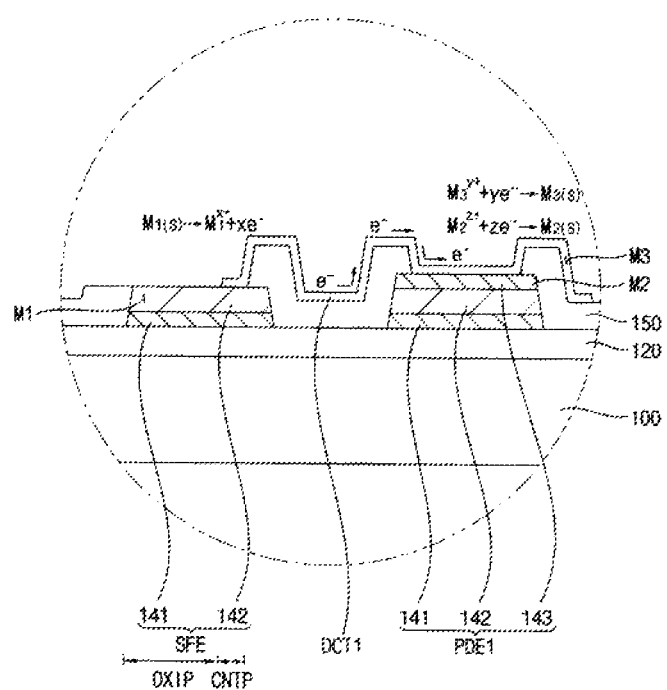
FIG. 4 is an enlarged cross-sectional view of 'A' of FIG. 3B.

FIG. 4 is an enlarged cross-sectional view of 'A' of FIG. 3B.

In FIG. 4, "M1" represents the first metal of the second data metal layer 142, "M2" represents the second metal of the third data metal layer 143, and "M3" represents the third metal of the first driving contact electrode DCT1.

Referring to FIG. 4, the first driving contact electrode DCT1 makes contact with the third data metal layer 143 of the first driving pad electrode PDE1 exposed through the contact hole CTH of the second insulation layer 150, and makes contact with the second data metal layer 142 of the sacrificial electrode SFE exposed through the contact portion CTP of the second insulation layer 150.

Since the first metal M1 of the second data metal layer 142 is easily oxidized with respect to the third metal M3 of the first driving contact electrode DCT1 directly exposed to the external side, the sacrificial electrode SFE exposed through the opening portion CTP may be easily oxidized with respect to the first driving contact electrode DCT1. As discussed above, a portion of the sacrificial electrode SFE is exposed by the opening portion CTP of the second insulation layer 150. Hereinafter, a portion of that exposed portion of the sacrificial electrode SFE which is exposed to be oxidized is represented as "an exposed portion OXIP," and a portion of that exposed portion of the sacrificial electrode SFE making direct contact with the first driving contact electrode DCT1 is represented as "a contact portion CNTP."

Since a standard reduction potential of the first metal M1 is different from that of the third metal M3, the first metal M1 corresponding to the exposed portion OXIP easily outputs electrons (e⁻) compared to the first driving contact electrode DCT1 so that an oxidation reaction such as the following Equation 1 is easily carried out.

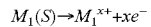   Equation 1

In Equation 1, 'x' is a natural number.

An oxidation reaction of the first metal M1 is superior to an oxidation reaction generated at the first driving contact electrode DCT1, so that the first driving contact electrode DCT1 easily receives the electrons (e) that are result of the oxidation reaction of the first metal M1. That is, the sacrificial electrode SFE is a cathode and the first driving contact electrode DCT1 is an anode, so that the electrons (e) are moved from the sacrificial electrode SFE to the first driving contact electrode DCT1. Thus, a reduction reaction such as the following Equation 2 is mainly generated rather than an oxidation reaction of the first driving contact electrode DCT1.

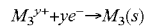   Equation 2

In Equation 2, 'y' is a natural number.

Moreover, since the second metal M2 of third data metal layer 143 of the first driving pad electrode PDE1 making contact with the first driving contact electrode DCT1 receives the electrons (e⁻) generated at the first metal M1, a reduction reaction such as the following Equation 3 is mainly generated rather than an oxidation reaction of the first driving pad electrode PDE1.

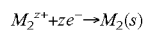   Equation 3

In Equation 3, 'z' is a natural number.

According to the above, a reduction reaction rather than an oxidation reaction is mainly generated at the first driving contact electrode DCT1 and the first driving pad electrode PDE1 after an oxidation reaction of the sacrificial electrode SFE, so that corrosion of the first driving pad electrode PDE1 is reduced or effectively prevented.

FIGS. 5A, 5B, 6A, 6B, 7A and 7B are cross-sectional views explaining an exemplary embodiment of a manufacturing method of the display substrate 600 shown in FIGS. 3A and 3B.

Figure 5A:
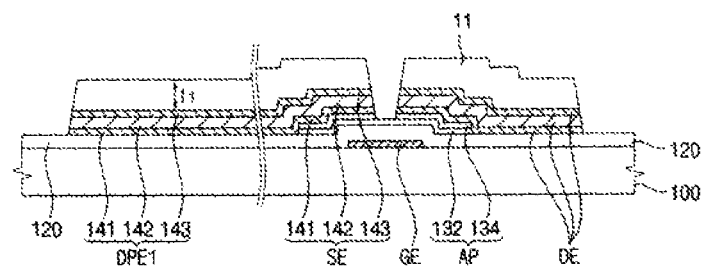
FIGS. 5A, 5B, 6A, 6B, 7A and 7B are cross-sectional views explaining an exemplary embodiment of a manufacturing method of the display substrate shown in FIGS. 3A and 3B.
Figure 5B:
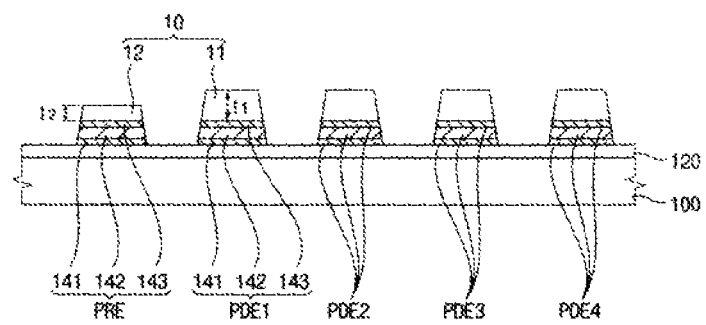

FIGS. 5A and 5B are cross-sectional views along I-I' and II-II' of FIG. 2 showing that the first to third data metal layers 141, 142 and 143 are patterned to form the data line DL, the first data pad electrode DPE1, the first to fourth driving pad electrodes PDE1, PDE2, PDE3 and PDE4 and a preliminary electrode PRE.

Referring to FIGS. 5A and 5B, the gate electrode GE, the first insulation layer 120 and the active pattern AP are sequentially formed on the base substrate 100. The gate electrode GE may be formed by patterning a gate metal layer formed on the base substrate 100. In this case, the gate line GL connected to the gate electrode GE, which is shown in FIGS. 1 and 2, may be formed. Moreover, gate patterns configuring the stages SRC1 and SRC2 may be formed in a process for forming the gate electrode GE. The first insulation layer 120 and the active pattern AP are formed on the base substrate 100 on which the gate electrode GE is formed.

The first, second and third data metal layers 141, 142 and 143 are sequentially formed on the base substrate 100 on which the first insulation layer 120 is formed, and a first photo pattern 10 is formed directly on the third data metal layer 143. The first photo pattern 10 includes a first thickness portion 11 having a first thickness t1 and a second thickness portion 12 having a second thickness t2. The second thickness t2 is smaller than the first thickness t1. The first photo pattern 10 may be formed by varying an amount of exposure through a halftone mask or a slit mask. The halftone mask has an exposing portion, a partial exposing portion (or a halftone portion) and a light-blocking portion.

The first thickness portion 11 may be disposed on an area corresponding to the data line DL, the first data pad electrode DPE1 and the first to fourth driving pad electrodes PDE1, PDE2, PDE3 and PDE4 shown in FIGS. 1 and 2. The second thickness portion 12 may be disposed on an area corresponding to the sacrificial electrode SFE shown in FIGS. 1 and 2.

The first, second and third data metal layers 141, 142 and 143 are etched by using the first photo pattern 10 as an etch stop layer. Thus, the first data pad electrode DPE1 and the first to fourth driving pad electrodes PDE1, PDE2, PDE3 and PDE4 having the first, second and third data metal layers 141, 142 and 143 are formed, and the preliminary electrode PRE is formed on an area corresponding to the sacrificial electrode SFE. The preliminary electrode PRE includes the first, second and third data metal layers 141, 142 and 143. A data pattern configuring the stages SRC1 and SCR2 may be formed through as process for forming the first data pad electrode DPE1 and the first to fourth driving pad electrodes PDE1, PDE2, PDE3 and PDE4.

Figure 6A:
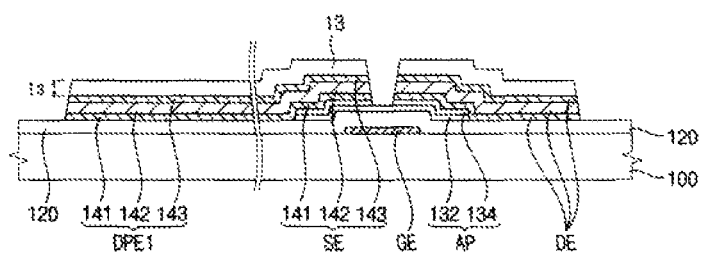
Figure 6B:
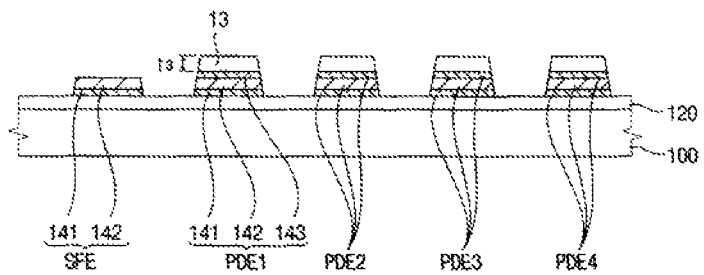

FIGS. 6A and 6B are cross-sectional views explaining an exemplary embodiment of a method of forming the sacrificial electrode SFE by using the preliminary electrode PRE.

Referring to FIGS. 6A and 6B, the second thickness portion 12 of the first photo pattern 10 is removed to form a remaining pattern 13. The remaining pattern 13 is removed to expose the second data metal layer 143 of the preliminary electrode PRE. However, the first thickness portion 11 is removed by a thickness of the second thickness portion 12, so that the first thickness portion 11 is reduced to have a third thickness t3 on the first data pad electrode DPE1 and the first to fourth driving pad electrodes PDE1, PDE2, PDE3 and PDE4.

Then, the third data metal layer 143 of the preliminary electrode PRE exposed through the remaining pattern 13 is removed by using the remaining pattern 13 as an etch stop layer. Thus, the sacrificial electrode SFE including only the first and second data metal layers 141 and 142 is formed.

Figure 7A:
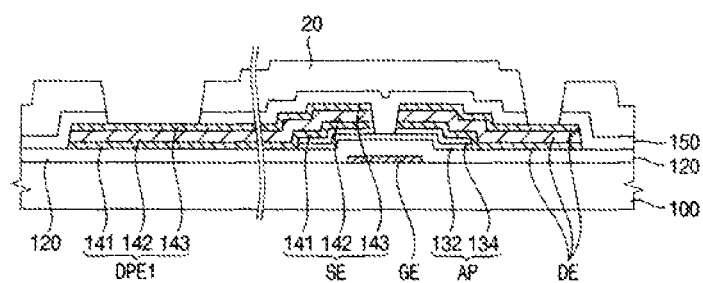
Figure 7B:
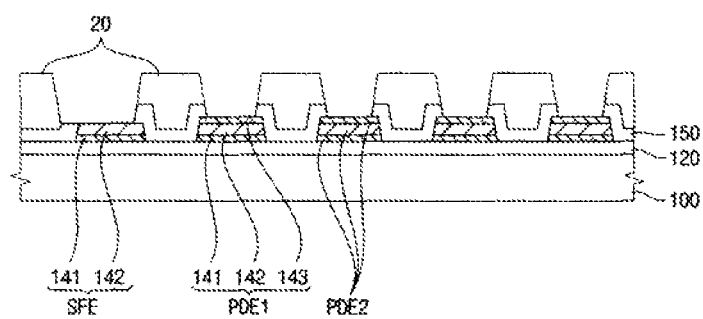

FIGS. 7A and 7B are cross-sectional views explaining steps forming the second insulation layer 150 having the contact hole CTH and the opening portion CTP formed thereon.

Referring to FIGS. 7A and 7B, the second insulation layer 150 is formed on the base substrate 100 on which the sacrificial electrode SFE, the first data pad electrode DPE1 and the first to fourth driving pad electrodes PDE1, PDE2, PDE3 and PDE4 are formed.

Then, a second photo pattern 20 is formed on the second insulation layer 150. The second photo pattern 20 exposes the second insulation layer 150 formed on the sacrificial electrode SFE, the first data pad electrode DPE1 and the first to fourth driving pad electrodes PDE1, PDE2, PDE3 and PDE4.

The second insulation layer 150 is etched by using the second photo pattern 20 as an etch stop layer, so that holes partially exposing the first data pad electrode DPE1 shown in FIG. 3A, the opening portion CTP partially exposing the sacrificial electrode SFE shown in FIG. 3B, and the contact hole CTH exposing the first to fourth driving pad electrodes PDE1, PDE2, PDE3 and PDE4 may be formed.

Then, a transparent electrode layer is formed on the second insulation layer 150 through which the opening portion CTP and the contact hole CTH are formed, and then the transparent electrode layer is patterned to form the pixel electrode PE and the first data contact electrode PCT1 shown in FIG. 3A and the first to fourth driving contact electrodes DCT1, DCT2, DCT3 and DCT4 shown in FIG. 3A. Thus, the display substrate 600 shown in FIGS. 3A and 3B may be manufactured.

According to the above, the sacrificial electrode SFE is formed, so that an oxidation of the driving pad part 400 may be minimized even though the second peripheral area PA2 is exposed to the external side of the display substrate 600. Thus, a corrosion of the driving pad part 400 may be reduced or effectively prevented.

Moreover, the sacrificial electrode SFE may be formed by using one mask in a process for forming the first to fourth driving pad electrodes PDE1, PDE2, PDE3 and PDE4 without an additional process. Thus, using only one mask may reduce or effectively prevent a manufacturing cost or a number of manufacturing processes for a display substrate from increasing, so that productivity of the display substrate may be enhanced.

In the illustrated exemplary embodiment, a triple-layer structure composed of Mo/Al/Mo is described. Alternatively, a double-layer structure composed of Ti/Cu may be described. In this case, a standard reduction potential of titanium (Ti) is relatively lower than that of copper (Cu), so that titanium (Ti) may be easily oxidized compared to copper (Cu) when titanium (Ti) makes contact with another material. That is, the data line DL, the source and drain electrodes SE and DE and the first to fourth driving pad electrodes PDE1, PDE2, PDE3 and PDE4 are formed in a double-layer structure including a first (lower) metal layer of titanium (Ti) and a second (upper) metal layer of copper (Cu) formed on the first metal layer. Then, the sacrificial electrode SFE includes only the first metal layer after removing the second metal layer, so that a corrosion of the driving pad part 400 may be reduced or effectively prevented.

Figure 8:
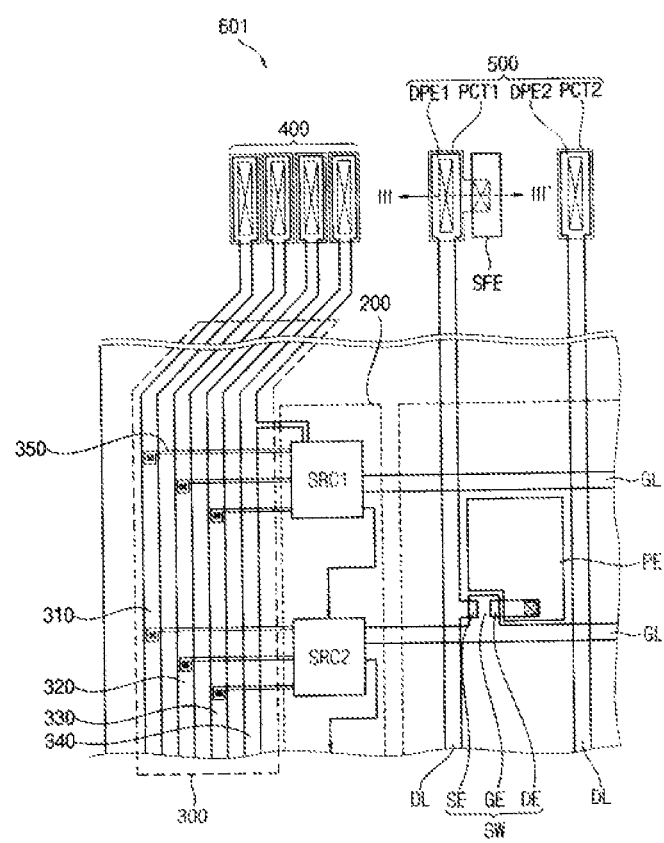
FIG. 8 is a plan view illustrating another exemplary embodiment of a display substrate according to the invention.

FIG. 8 is a plan view illustrating another exemplary embodiment of a display substrate according to the invention.

Figure 9:
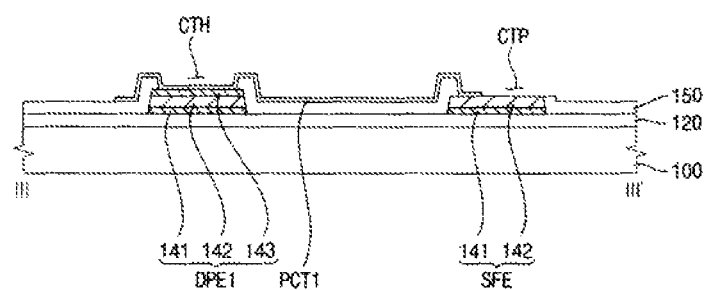
FIG. 9 is a cross-sectional view taken along line III-III' of FIG. 8.

FIG. 9 is a cross-sectional view taken along line III-III' of FIG. 8.

A display substrate 601 shown in FIGS. 8 and 9 is substantially the same as the display substrate 600 of FIGS. 1, 2, 3A and 3B except that a sacrificial electrode SFE is connected to a data pad part 500 not to a driving pad part 400. Thus, any repetitive detailed explanation will hereinafter be omitted.

Referring to FIGS. 8 and 9, the data pad part 500 of the display substrate 601 includes a first data pad electrode DPE1, a second data pad electrode DPE2, a first data contact electrode PCT1 and a second data contact electrode PCT2. The sacrificial electrode SFE of the display substrate 601 is electrically connected to the first data pad electrode DPE1. Alternatively, a further sacrificial electrode different from the sacrificial electrode SFE connected to the first data pad electrode DPE1 is formed, so that the second data contact electrode PCT2 may be also electrically connected to the further sacrificial electrode different from the sacrificial electrode shown in FIGS. 8 and 9.

The first data pad electrode DPE1 is formed on a first insulation layer 120 which is formed on a base substrate 100 to include a first data metal layer 141, a second data metal layer 142 and a third metal layer 143. The sacrificial electrode SFE may include the first data metal layer 141 and the second data metal layer 142. A relationship of a standard reduction potential of a metal configuring the first to third data metal layers 141, 142 and 143 is substantially the same as that of FIGS. 3A and 3B, and thus any repetitive detailed explanation will hereinafter be omitted.

The second insulation layer 150 may include the contact hole CTH partially exposing the first data pad electrode DPE1 and an opening portion CTP partially exposing the sacrificial electrode SFE.

The first data contact electrode PCT1 is formed on the second insulation layer 150 to fully cover the first data pad electrode DPE1 exposed through the contact hole CTH, and to partially cover the sacrificial electrode SFE exposed through the opening portion CTP. Thus, a portion of the sacrificial electrode SFE is exposed to the external side of the display substrate 601. Therefore, an oxidation reaction generated at the sacrificial electrode SFE may be superior to an oxidation reaction generated at the first data contact electrode PCT1 or the first data pad electrode DPE1.

In one exemplary embodiment, for example, the opening portion CTP may expose a portion of a first end portion of the sacrificial electrode SFE. In FIG. 8, the first data contact electrode PCT1 is protruded from the first data pad electrode DPE1 to form a T-shape in the plan view. Alternatively, the first data contact electrode PCT1 is formed to have an I-shape such as a shape of the first driving contact electrode DCT1 of FIG. 2, so that the first data contact electrode PCT1 may fully cover a first end portion of the first data pad electrode DPE1.

Figure 10A:
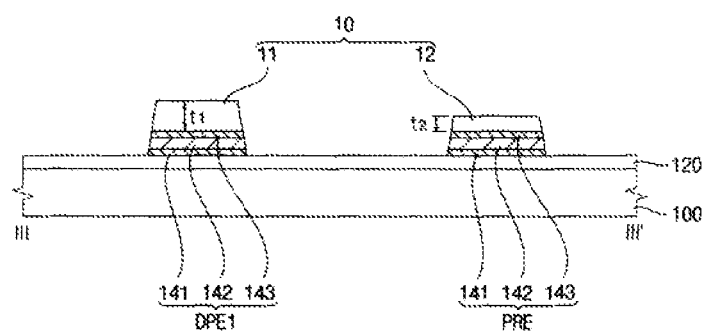
FIGS. 10A and 10B are cross-sectional views explaining an exemplary embodiment of a manufacturing method of the display substrate shown in FIG. 9.
Figure 10B:
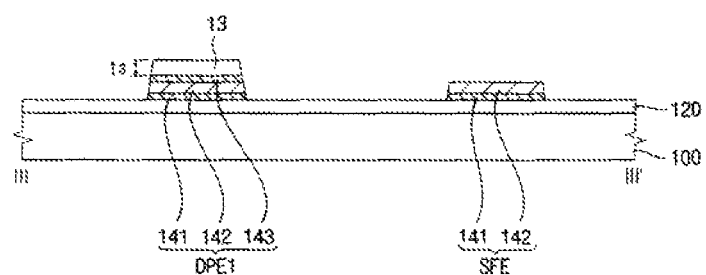

FIGS. 10A and 10B are cross-sectional views explaining an exemplary embodiment of a manufacturing method of the display substrate shown in FIG. 9.

In a manufacturing method of the display substrate 601 shown in FIGS. 8 and 9, a process for forming the gate electrode GE, the first insulation layer 120 and the active pattern AP (refer to FIG. 3A) of the switching element SW on the base substrate 100 is substantially the same as that of FIGS. 5A and 5B, and thus any repetitive detailed explanation will hereinafter be omitted.

Referring to FIG. 10A, the first, second and third data metal layers 141, 142 and 143 are formed on the base substrate 100, and a first photo pattern 10 is formed on the third data metal layer 143.

The first photo pattern 10 has a first thickness portion 11 formed on an area corresponding to the first data pad electrode DPE1 shown in FIG. 9, and a second thickness portion 12 formed on an area corresponding to the sacrificial electrode SFE. A first thickness t1 of the first thickness portion 11 is relatively larger than a second thickness t2 of the second thickness portion 12. The first photo pattern 10 is substantially the same as that of FIGS. 5A and 5B except for a position of the first and second thickness portions 11 and 12, and thus any repetitive detailed explanation will hereinafter be omitted.

The first, second and third data metal layers 141, 142 and 143 are patterned by using the first photo pattern 10 as an etch stop layer. Thus, the first data pad electrode DPE1 and a preliminary electrode PRE are formed.

Referring to FIG. 10B, the second thickness portion 12 of the first photo pattern 10 is removed to form a remaining pattern 13. The remaining pattern 13 is removed to expose the third data metal layer 143 of the preliminary electrode PRE, and then the third data metal layer 143 is removed by using the remaining pattern 13 as an etch stop layer. Thus, the sacrificial electrode SFE including only the first and second data metal layers 141 and 142 may be formed.

Then, the second insulation layer 150 is formed, and then the second insulation layer 150 is patterned. A process for forming the pixel electrode PE and the first and second data contact electrodes PCT1 and PCT2 on the second insulation layer 150 is substantially the same as that explained in FIGS. 7A and 7B, and thus any repetitive detailed explanation will hereinafter be omitted. Therefore, the display substrate 601 shown in FIGS. 8 and 9 may be manufactured.

According to the above, the sacrificial electrode SFE is formed, so that an oxidation of the data pad part 500 may be minimized even though the second peripheral area PA2 is exposed to the external side. Thus, a corrosion of the data pad part 500 may be prevented.

Figure 11:
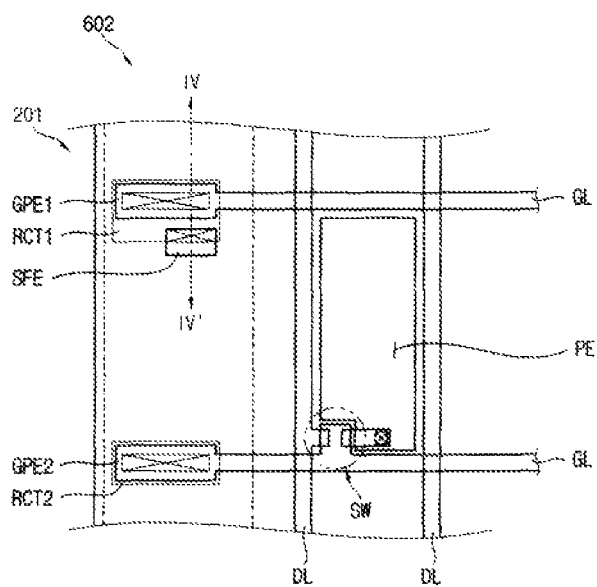
FIG. 11 is a plan view illustrating still another exemplary embodiment of a display substrate according to the invention.

FIG. 11 is a plan view illustrating still another exemplary embodiment of a display substrate according to the invention.

Figure 12:
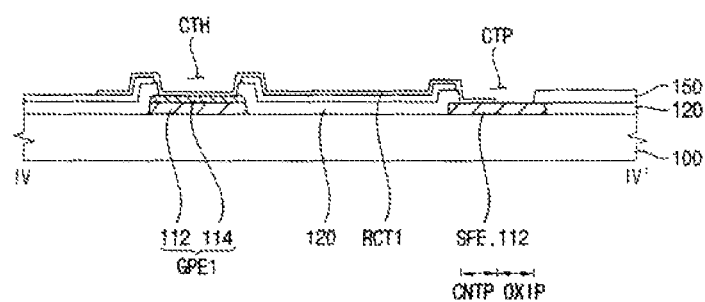
FIG. 12 is a cross-sectional view taken along line IV-IV' of FIG. 11.

FIG. 12 is a cross-sectional view taken along line IV-IV' of FIG. 11.

The display substrate 602 shown in FIGS. 11 and 12 is substantially the same as the display substrate 600 explained in FIGS. 1, 2, 3A and 3B except that a gate pad part 201 is formed on an area corresponding to the gate drive circuit 200 of FIGS. 1 and 2, and a sacrificial electrode SFE is connected to the gate pad part 201 not the driving pad part 400. Thus, any repetitive detailed explanation will hereinafter be omitted.

Referring to FIGS. 11 and 12, the gate pad part 201 of the display substrate 602 includes a first gate pad electrode GPE1, a second gate pad electrode GPE2, a first gate contact electrode RCT1 and a second gate contact electrode RCT2. A driving chip (not shown) on which a gate drive circuit is integrated may be mounted on the gate pad part 201.

A sacrificial electrode SFE of the display substrate 602 is electrically connected to the first gate pad electrode GPE1. Alternatively, the display substrate 602 may include another sacrificial electrode different from the sacrificial electrode SFE connected to the first gate pad electrode GPE1, so that the second gate contact electrode RCT2 may be also be connected to the another sacrificial electrode different from the sacrificial electrode SFE shown in FIGS. 11 and 12. In FIG. 11, it is described that a size of the sacrificial electrode SFE is narrower than the first gate pad electrode GPE1. Alternatively, a shape and a size of the sacrificial electrode SFE may be substantially the same as that of the first gate pad electrode GPE1. Further alternatively, a size of the sacrificial electrode SFE may be wider than that of the first gate pad electrode GPE1.

The first gate pad electrode GPE1 may be on the base substrate 100 to include a first gate metal layer 112 and a second gate metal layer 114. The sacrificial electrode SFE may include only the first gate metal layer 112. A standard reduction potential of a metal configuring the first gate metal layer 112 may be relatively lower than that of a metal respectively configuring each of the second gate metal layer 114, and the first and second gate contact electrodes RCT1 and RCT2. Thus, the sacrificial electrode SFE may reduce or effectively prevent the first gate pad electrode GPE1 from being corroded. A principle that a corrosion of the first gate pad electrode GPE1 and the first gate contact electrode RCT1 is reduced or effectively prevented may be substantially the same as a description of FIGS. 3A and 3B, and thus any repetitive detailed explanation will hereinafter be omitted.

The sacrificial electrode SFE may include a contact portion CNTP making contact with the first gate contact electrode RCT1 to be covered, and an exposed portion OXIP exposed to the external side. An oxidation reaction is generated at the exposed portion OXIP to generate electrons, and the electrons are moved toward the first gate pad electrode GPE1 and the first contact electrode RCT1 through the contact portion CNTP. Thus, an oxidation reaction may be reduced or effectively prevented at the first gate pad GPE1 and the first contact electrode RCT1.

In one exemplary embodiment, for example, the first gate metal layer 112 may include aluminum (Al), and the second gate metal layer 114 may include molybdenum (Mo). Alternatively, the first gate metal layer 112 may include titanium (Ti), and the second gate metal layer 114 may include copper (Cu). In an exemplary embodiment, a buffer layer (not shown) capable of enhancing an adhesive strength between the first gate metal layer 112 and the base substrate 100 may be further formed between the first gate metal layer 112 and the base substrate 100.

A first insulation layer 120 is on the base substrate 100 including the first gate pad electrode GPE1 and the sacrificial electrode SFE. A second insulation layer 150 is on the first insulation layer 120. Although not shown in FIGS. 11 and 12, the second insulation layer 150 may also be on the first and second data pad electrodes DPE1 and DPE2 and the first to fourth driving pad electrodes PDE1, PDE2, PDE3 and PDE4.

The first and second insulation layers 120 and 150 have the contact hole CTH extending through thicknesses thereof and partially exposing the first gate pad electrode GPE1, and an opening portion CTP extending through thicknesses thereof and partially exposing the sacrificial electrode SFE. The first gate contact electrode RCT1 fully covers the first gate pad electrode GPE1 exposed through the contact hole CTH, and partially covers the sacrificial electrode SFE exposed through the opening portion CTP. Thus, the first gate contact electrode RCT1 makes contact with the contact portion CNTP to expose the exposed portion OXIP.

Figure 13:
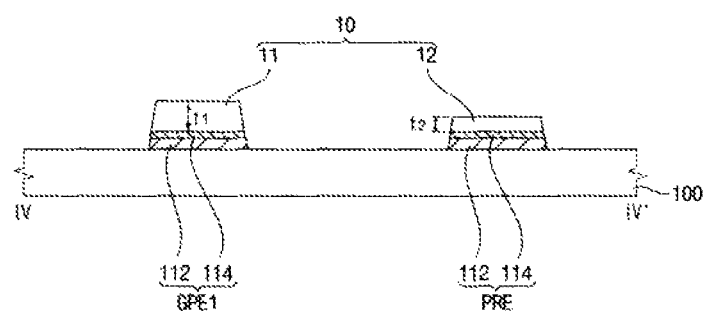
FIG. 13 is a cross-sectional view explaining an exemplary embodiment of a manufacturing method of the display substrate shown in FIG. 12.

FIG. 13 is a cross-sectional view explaining an exemplary embodiment of a manufacturing method of the display substrate 602 shown in FIG. 12.

Referring to FIG. 13, the first gate metal layer 112 and the second gate metal layer 114 are sequentially formed on the base substrate 100. In one exemplary embodiment, for example, the first gate metal layer 112 may include molybdenum (Mo), and the second gate metal layer 114 may include aluminum (Al). Alternatively, the first gate metal layer 112 may include titanium (Ti), and the second gate metal layer 114 may include copper (Cu).

The first photo pattern 10 including the first thickness portion 11 and the second thickness portion 12 is formed on the second gate metal layer 114. The first thickness portion 11 is formed on an area corresponding to the first gate pad electrode GPE1 of FIG. 12. Although not shown in FIG. 13, the first thickness portion 11 may be formed on an area corresponding to the gate line GL and the gate electrode GE of the switching element SW connected to the gate line GL. The second thickness portion 12 may have a second thickness t2 smaller than the first thickness t1 of the first thickness portion 11. The second thickness portion 12 may be formed on an area corresponding to the sacrificial electrode SFE.

The first and second gate metal layers 112 and 114 are etched by using the first photo pattern 10 as an etch stop layer to form the first gate pad electrode GPE1 and the preliminary electrode PRE. Each of the first gate pad electrode GPE1 and the preliminary electrode PRE includes both the first and second gate metal layers 112 and 114.

Then, the second thickness portion 12 of the first photo pattern 10 is removed to form a remaining pattern (not shown), and the second gate metal layer 114 of the preliminary electrode PRE is removed by using the remaining pattern as an etch stop layer. The remaining pattern may protect the second gate metal layer 114 of the first gate pad electrode GPE1. Thus, the sacrificial electrode SFE including only the first gate metal layer 112 is formed.

A following process after the first gate pad electrode GPE1 and the sacrificial electrode SFE are formed will be explained in detail with reference to FIGS. 11 and 12. Referring again to FIGS. 11 and 12, the first insulation layer 120 is formed on the base substrate 100 on which the first gate pad electrode GPE1 and the sacrificial electrode SFE are formed, and then the data line DL, the source electrode SE and the drain electrode DE are formed on the first insulation layer 120. Here, the source electrode SE is connected to the data line DL, and the drain electrode DE is spaced apart from the source electrode SE. In this case, a data pad electrode connected to the data line DL may be formed. Alternatively, an active pattern may be further formed on the first insulation layer 120 corresponding to an area where the gate electrode is formed.

Then, the second insulation layer 150 is formed on the base substrate 100 on which the data line DL, the source electrode SE and the drain electrode DE are formed, and the first and second insulation layers 120 and 150 are patterned to form the opening portion CTP and the contact hole CTP. A process for patterning the first and second insulation layers 120 and 150 is substantially the same as a process for patterning the second insulation layer 150 by using the second photo pattern 20 explained in FIGS. 7A and 7B except that a position of the opening portion CTP and the contact hole CTP and the first insulation layer 120 is further etched. Since the first insulation layer 120 should be etched simultaneously with the second insulation layer 150, an etching gas amount and an etching time may be increased with respect to a process of FIGS. 7A and 7B.

A transparent electrode layer is formed on the first and second insulation layers 120 and 150 through which the opening portion CTP and the contact hole CTH are formed, and then the transparent electrode layer is patterned to form the first gate contact electrode RCT1. In this case, the pixel electrode PE electrically connected to the switching element SW may also be formed. Thus, the display substrate 602 shown in FIGS. 11 and 12 may be manufactured.

According to the above exemplary embodiment, the sacrificial electrode SFE is formed, so that an oxidation of the gate pad part 201 may be minimized even though the gate pad part 201 is exposed to the external side. Moreover, the sacrificial electrode SFE may be formed by using one mask in a process for forming the first gate pad electrode GPE1 without an additional process. Thus, using only one mask may reduce or effectively prevent a manufacturing cost or a number of manufacturing processes for a display substrate from increasing, so that productivity of the display substrate may be enhanced.

Figure 14:
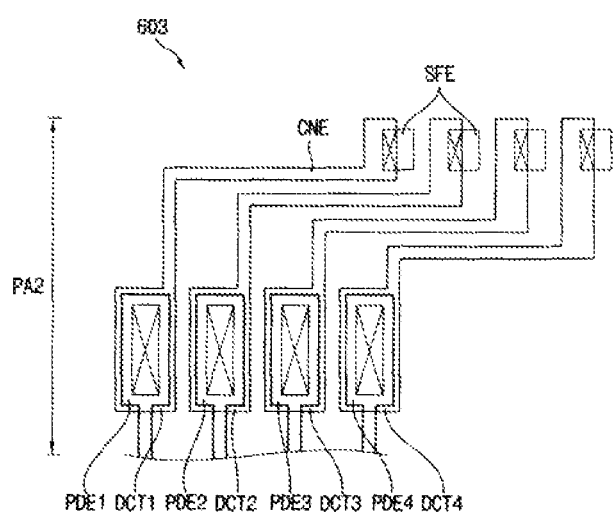
FIG. 14 is a plan view illustrating still another exemplary embodiment of a display substrate according to the invention.

FIG. 14 is a plan view illustrating still another exemplary embodiment of a display substrate according to the invention.

A display substrate 603 of FIG. 14 is substantially the same as the display substrate 600 of FIGS. 1, 2, 3A and 3B except that plural sacrificial electrodes SFE are respectively connected to the first to fourth driving pad electrodes PDE1, PDE2, PDE3 and PDE4, and first to fourth driving contact electrodes DCT1, DCT2, DCT3 and DCT4 include a connection portion CNE. Thus, any repetitive detailed explanation will hereinafter be omitted.

Referring to FIG. 14, each of the sacrificial electrodes SFE is on a collective planar area spaced apart from a collective planar area on which includes the first to fourth driving pad electrodes PDE1, PDE2, PDE3 and PDE4. The area including the sacrificial electrodes SFE may be a portion of the second peripheral area PA2 of the display substrate shown in FIGS. 1 and 2. Each of the first to fourth driving pad electrodes PDE1, PDE2, PDE3 and PDE4 may be electrically connected to the sacrificial electrodes SFE through connection portions CNE of the first to fourth driving contact electrodes DCT1, DCT2, DCT3 and DCT4, respectively. Each of the connection portions CNE may respectively extend from upper portions of the first to fourth driving pad electrodes PDE1, PDE2, PDE3 and PDE4 in the plan view to the area corresponding to the sacrificial electrodes SFE and to have a substantially line shape. The first to fourth driving contact electrodes DCT1, DCT2, DCT3 and DCT4 and their respective connection portions CNE may respectively form continuous single, unitary, indivisible members.

A manufacturing method of the display substrate 603 of FIG. 14 is substantially the same as a manufacturing method of the display substrate 600 explained in FIGS. 5A, 5B, 6A, 6B, 7A and 7B except a formation position of the sacrificial electrodes SFE and that each of the first to fourth driving contact electrodes DCT1, DCT2, DCT3 and DCT4 includes the connection portion CNE of a line shape, and thus any repetitive detailed explanation will be omitted.

According to the above exemplary embodiment, each of the first to fourth driving pad electrodes PDE1, PDE2, PDE3 and PDE4 may be electrically connected to the sacrificial electrodes SFE through the connection portion CNE of the first to fourth driving contact electrodes DCT1, DCT2, DCT3 and DCT4, so that the sacrificial electrodes SFE may be on a portion of the second peripheral area PA2 exposed to the external side without a modification of design of the first to fourth driving pad electrodes PDE1, PDE2, PDE3, PDE4.

Figure 15:
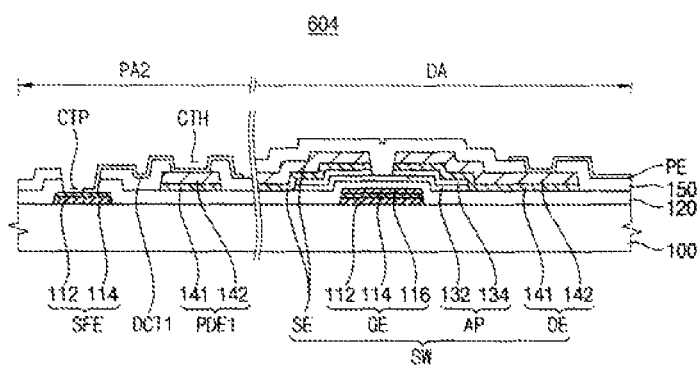
FIG. 15 is a cross-sectional view illustrating still another exemplary embodiment of a display substrate according to the invention.

FIG. 15 is a cross-sectional view illustrating still another exemplary embodiment of a display substrate according to f the invention.

A plan structure of a display substrate of FIG. 15 is substantially the same as that of the display substrate of FIGS. 1 and 2. Thus, in the display substrate of FIG. 15, the same reference numerals will be used to refer to the same or like parts as those described in FIGS. 1 and 2 and thus any repetitive detailed explanation will hereinafter be omitted.

Referring to FIGS. 1, 2 and 15, the display substrate 604 includes the gate line GL, the data line DL, the switching element SW, the pixel electrode PE, the gate drive circuit 200, the driving line part 300, the driving pad part 400, the sacrificial electrode SFE and the data pad part 500. The gate line GL, the data line DL, the switching element SW and the pixel electrode PE are formed on a display area DA. The gate drive circuit 200 and the driving line part 300 are on the first peripheral area PA1 adjacent to the display area DA. The driving pad part 400, the sacrificial electrode SFE and the data pad part 500 are on the second peripheral area PA2.

The gate electrode GE of the switching element SW includes the first gate metal layer 112, the second gate metal layer 114 and a third gate metal layer 116 sequentially on a base substrate 100. The first gate metal layer 112 may include molybdenum (Mo), the second gate metal layer 114 may include aluminum (Al), and the third metal layer 116 may include molybdenum (Mo). Moreover, the gate line GL connected to the gate electrode GE and a gate pad electrode (not shown) connected to an end portion of the gate line GL may include the first, second and third gate metal layers 112, 114 and 116.

Each of the source electrode SE and the drain electrode DE of the switching element SW may include the first data metal layer 141 and the second data metal layer 142. The first data metal layer 141 may include titanium (Ti), and the second data metal layer 142 may include copper (Cu). Moreover, the data line DL connected to the source electrode SE and the data pad electrodes DPE1 and DPE2 connected to an end portion of the data line DL may include the first and second data metal layers 141 and 142.

The first driving pad electrode PDE1 of the driving pad part 400 may include the first data metal layer 141 and the second data metal layer 142. The first driving pad electrode PDE1 may be on the first insulation layer 120 to make direct contact with the first driving contact electrode DCT1 through the contact hole CTH penetrated through the second insulation layer 150. The first driving contact electrode DCT1 may include a substantially same metal as the pixel electrode PE. The first driving contact electrode DCT1 and the pixel electrode PE may include indium (In). In one exemplary embodiment, for example, the first driving contact electrode DCT1 and the pixel electrode PE may include indium oxide. The second to fourth driving pad electrodes PDE2, PDE3 and PDE4 that are shown in FIG. 2 have a cross-sectional structure that is same as that of the first driving pad electrode PDE1 except they are connected to different types of the driving lines, and thus any repetitive detailed explanation will hereinafter be omitted.

The sacrificial electrode SFE may include the first and second gate metal layers 112 and 114. A portion of the exposed second gate metal layer 114 of the sacrificial electrode SFE is contacted with the first driving contact electrode DCT1 through an opening portion CTP extending through both the first and second insulation layers 120 and 150, and a remaining portion of the exposed second gate metal layer 114 of the sacrificial electrode SFE is exposed to the external side.

Base on the above discussion, o portion of the exposed second gate metal layer 114 of the sacrificial electrode SFE is exposed to the external side and another portion of the exposed second gate metal layer 114 is covered by the first driving contact electrode DCT1 including indium (In) having a standard reduction potential higher than that of aluminum (Al) of the second gate metal layer 114, so that electrons which are generated by an oxidation reaction at the portion of the second gate metal layer 114 exposed to the external side may be easily moved to the portion of the second gate metal layer 114 covered by the first driving contact electrode DCT1. Since an uppermost layer of the first driving pad electrode PDE1 is the second data metal layer 142 including titanium (Ti) having a standard reduction potential even higher than that indium (In) of the first driving contact electrode DCT1 and the uppermost layer including aluminum (Al) of the sacrificial electrode SFE, the first driving pad electrode PDE1 may easily receive electrons generated at the second gate metal layer 114 of the sacrificial electrode SFE. Thus, since the uppermost layer of the first driving pad electrode PDE1 has a standard reduction potential even higher than the uppermost layers of the first driving contact electrode DCT1 and the sacrificial electrode SFE, corrosion of the first driving pad electrode PDE1 may be reduced or effectively prevented.

Figure 16A:
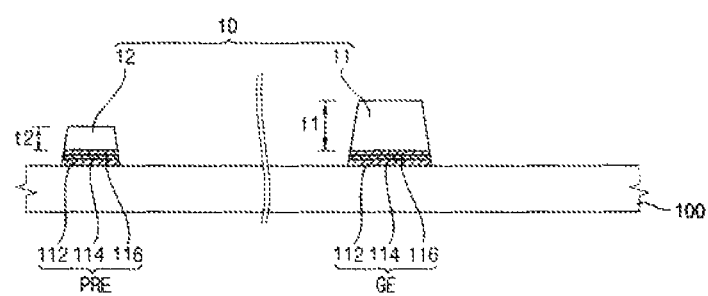
FIGS. 16A to 16C are cross-sectional views explaining an exemplary embodiment of a manufacturing method of the display substrate shown in FIG. 15.
Figure 16B:
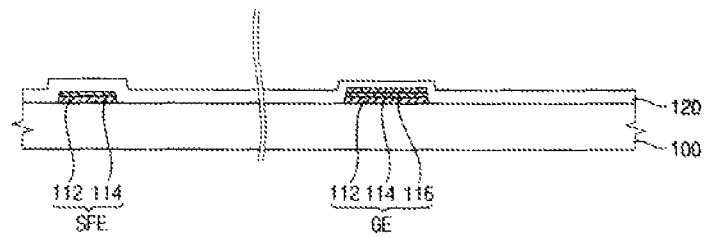
Figure 16C:
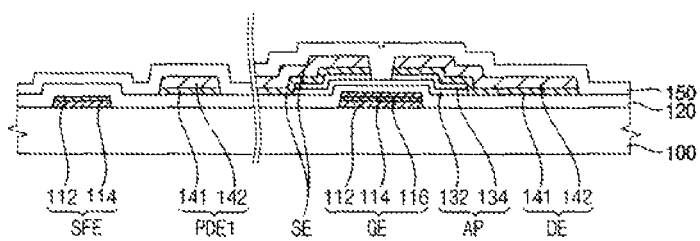

FIGS. 16A to 16C are cross-sectional views explaining an exemplary embodiment of a manufacturing method of the display substrate shown in FIG. 15.

Referring to FIG. 16A, the first gate metal layer 112, the second gate metal layer 114 and the third gate metal layer 116 are sequentially formed on the base substrate 100. The first to third gate metal layers 112, 114 and 116 are patterned to form a preliminary electrode PRE and the gate electrode GE. The preliminary electrode PRE may form the sacrificial electrode SFE through the following processes.

In one exemplary embodiment, for example, the first photo pattern 10 is formed on the third gate metal layer 116, and then the first to third gate metal layers 112, 114 and 116 are etched by using the first photo pattern 10 as an etch stop layer. The first photo pattern 10 includes the first thickness portion 11 having the first thickness t1, and the second thickness portion 12 having the second thickness t2. In this case, the first thickness t1 may be greater than the second thickness t2. The first thickness portion 11 may be disposed on a formation area of the gate electrode GE and the gate line GL, and the second thickness portion 12 may be disposed on a formation area of the sacrificial electrode SFE. Thus, the preliminary electrode PRE may be formed on the formation area of the sacrificial electrode SFE.

Referring to FIG. 16B, the second thickness portion 12 and the third gate metal layer 116 of the preliminary electrode PRE are removed to form the sacrificial electrode SFE. Thus, an uppermost layer of the sacrificial electrode SFE is to be the second gate metal layer 114. The first insulation layer 120 is formed on the base substrate 100 on which the sacrificial electrode SFE and the gate electrode GE are formed.

Referring to FIG. 16C, the active pattern AP of the switching element SW is formed on the base substrate 100 on which the first insulation layer 120 is formed. The active pattern AP may include the semiconductor layer 132 and the ohmic contact layer 134.

Then, the first data metal layer 141 and the second data metal layer 142 are sequentially formed on the base substrate 100 on which the active pattern AP is formed. The first and second data metal layers 141 and 142 may be patterned to form the source electrode SE, the drain electrode DE and the first driving pad electrode PDE1.

The second insulation layer 150 is formed on the base substrate 100 on which the source and drain electrodes SE and DE and the first driving pad electrode PDE1 are formed.

Referring to FIGS. 15 and 16C, thicknesses of the first and second insulation layers 120 and 150 on the sacrificial electrode SFE are removed by using a second photo pattern (not shown) as an etch stop layer to form the opening portion CTP, and a thickness of the second insulation layer 150 on the first driving pad electrode PDE1 is removed by using the second photo pattern as an etch stop layer to form the contact hole CTH.

A transparent electrode layer is formed on the base substrate 100 through the opening portion CTP and the contact hole CTH, and then the transparent electrode layer may be patterned to form the pixel electrode PE and the first driving contact electrode DCT1. The first driving contact electrode DCT1 may partially cover the exposed second gate metal layer 114 of the sacrificial electrode SFE, and the first driving contact electrode DCT1 may fully cover a remaining portion of the second gate metal layer 142 exposed through the contact hole CTH.

According to the above, the sacrificial electrode SFE is formed in a process for forming the gate electrode GE, and the sacrificial electrode SFE is connected to the first driving pad electrode PDE1 formed by a metal layer different from the gate electrode GE, so that the sacrificial electrode SFE may be formed without an additional process for forming the sacrificial electrode SFE. Moreover, a metal layer, which has a standard reduction potential different from that of the sacrificial electrode SFE, is connected to the sacrificial electrode SFE, so that a corrosion of the first driving pad electrode PDE1 may be reduced or effectively prevented.

In FIGS. 15, 16A to 16C, it is described that the first driving contact electrode DCT1 connected to the first driving pad electrode PDE1 of the driving pad part 400 is connected to the sacrificial electrode SFE. Alternatively, a further sacrificial electrode, which is connected to one of the data pad electrodes DPE1 and DPE2 of the data pad part 500 to include the first and second gate metal layers 112 and 114, is formed, so that a corrosion of the driving pad part 500 may be reduced or effectively prevented.

In FIG. 15, it is described that the gate line GL and the gate electrode GE have a triple-layer structure including first, second and third gate metal layers 112, 114 and 116. Alternatively, the gate line GL and the gate electrode GE may have a double-layer structure including two gate metal layers different from each other. In one exemplary embodiment, for example, the gate line GL and the gate electrode GE may have a double-layer structure including the second and third gate metal layers 114 and 116 in which the first gate metal layer 112 is omitted. That is, an uppermost layer of the gate line GL and the gate electrode GE is the third gate metal layer 116 including molybdenum (Mo), and the second gate metal layer 114 including aluminum (Al) is formed between the third gate metal layer 116 and the base substrate 100. In this case, since the first gate metal layer 112 is omitted, the sacrificial electrode SFE may include a single-layer structure including only the second gate metal layer 114.

Figure 17:
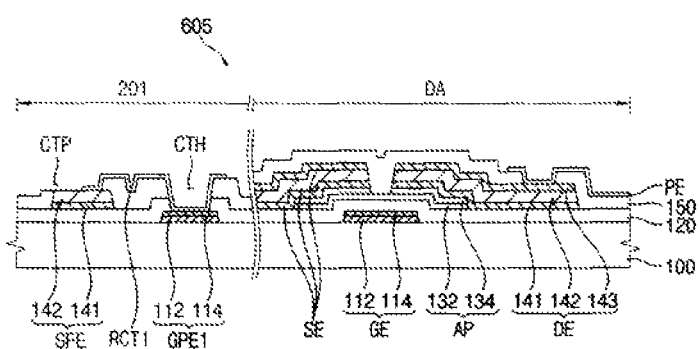
FIG. 17 is a cross-sectional view illustrating still another exemplary embodiment of a display substrate according to the invention.

FIG. 17 is a cross-sectional view illustrating still another exemplary embodiment of a display substrate according to fu the invention.

A plan structure of a display substrate of FIG. 17 is substantially the same as that of the display substrate of FIG. 11. Thus, in the display substrate of FIG. 17, the same reference numerals will be used to refer to the same or like parts as those described in FIG. 11 and thus any repetitive detailed explanation will hereinafter be omitted.

Referring to FIGS. 11 and 17, the display substrate 605 includes the gate line GL, the data line DL, the switching element SW and the pixel electrode PE that are on the display area DA, and the gate pad part 201 and the sacrificial electrode SFE that are formed on the peripheral area adjacent to the display area DA. A driving chip (not shown) in which a gate drive circuit is integrated may be mounted on the gate pad part 201. The gate pad part 201 may include the first gate pad electrode GPE1, the second gate pad electrode GPE2, the first gate contact electrode RCT1 and the second gate contact electrode RCT2 as shown in FIG. 11.

The gate electrode GE of the switching element SW includes the first gate metal layer 112 and the second gate metal layer 114 that are sequentially on the base substrate 100. In one exemplary embodiment, for example, the first gate metal layer 112 may include titanium (Ti), and the second gate metal layer 114 may include copper (Cu). Moreover, the gate line GL connected to the gate electrode GE may include the first and second gate metal layers 112 and 114.

The source electrode SE and the drain electrode DE of the switching element SW may include the first data metal layer 141, the second data metal layer 142 and the third data metal layer 143. The first data metal layer 141 may include molybdenum (Mo), the second data metal layer 142 may include aluminum (Al), and the third data metal layer 143 may include molybdenum (Mo). Moreover, the data line DL connected to the source electrode SE, and plural data pad electrodes (not shown) connected to an end portion of the data line DL may include the first to third data metal layers 141, 142 and 143.

A first gate pad electrode GPE1 connected to an end portion of the gate line GL may include the first and second gate metal layers 112 and 114. The first gate pad electrode GPE1 may make direct contact with a first gate contact electrode RCT1 through a contact hole CTH penetrating the first and second insulation layers 120 and 150. The first gate contact electrode RCT1 may include a metal substantially identical to the pixel electrode PE. The second gate pad electrode GPE2 shown in FIG. 11 is substantially the same as the first gate pad electrode GPE1 except for a gate line GL, and thus any repetitive detailed explanation will hereinafter be omitted.

The sacrificial electrode SFE may include both the first and second data metal layers 141 and 142. A portion of the exposed second data metal layer 142 of the sacrificial electrode SFE is directly contacted to the first gate contact electrode RCT1 through an opening portion CTP penetrating the second insulation layer 150, and a remaining portion of exposed the second data metal layer 142 is exposed to the external side.

Based on the above portion, one portion of the exposed second data metal layer 142 of the sacrificial electrode SFE is exposed to the external side and another portion of exposed the second data metal layer 142 is covered by the first gate contact electrode RCT1 including indium (In) having a standard reduction potential higher than that of aluminum (Al) of the second data metal layer 142, so that electrons which are generated by an oxidation reaction at the portion of the second data metal layer 142 exposed to the external side may be easily moved to the portion of the second data metal layer 142 covered by the first gate contact electrode RCT1. Since an uppermost layer of the first gate pad electrode GDE1 is the second gate metal layer 114 including titanium (Ti) having a standard reduction potential higher than that of indium (In) of the first gate contact electrode RCT1 and the uppermost layer including aluminum (Al) of the sacrificial electrode SFE, the first gate pad electrode GDE1 may easily receive electrons generated at the second gate metal layer 114. Thus, since the uppermost layer of the first gate pad electrode GDE1 has a standard reduction potential even higher than the uppermost layers of the first gate contact electrode RCT1 and the sacrificial electrode SFE, corrosion of the first gate pad electrode GDE1 may be reduced or effectively prevented. In addition, the above discussed structure of metal layers may reduced or effectively prevent corrosion of the gate pad part 201 including the first driving pad electrode PDE1.

Figure 18A:
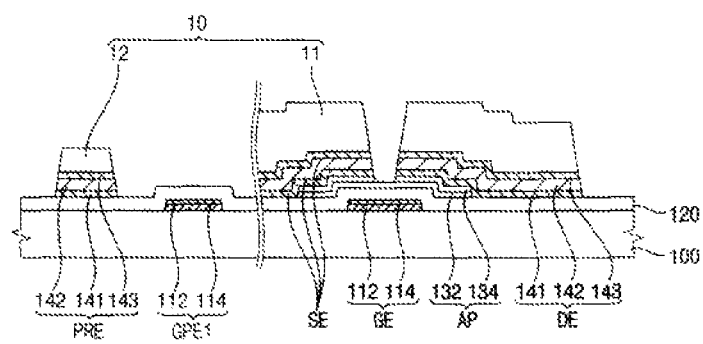
FIGS. 18A and 18B are cross-sectional views explaining an exemplary embodiment of a manufacturing method of the display substrate shown in FIG. 17.
Figure 18B:
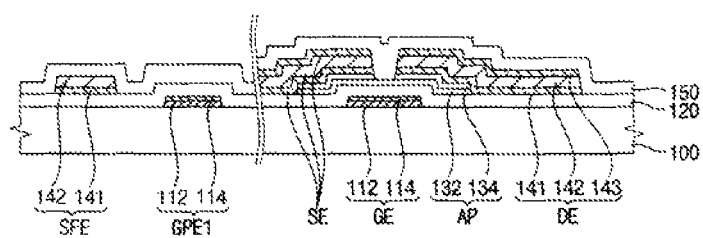

FIGS. 18A and 18B are cross-sectional views explaining an exemplary embodiment of a manufacturing method of the display substrate 605 shown in FIG. 17.

Referring to FIG. 18A, the first and second gate metal layers 112 and 114 are sequentially formed on the base substrate 100, and then the first and second gate metal layers 112 and 114 are patterned to form the gate electrode GE and the first gate pad electrode GPE1.

Then, the first insulation layer 120 is formed on the base substrate 100 on which the gate electrode GE and the first gate pad electrode GPE1 are formed, and then the active pattern AP of the switching element SW is formed on the first insulation layer 120 which overlaps with the gate electrode GE.

The first, second and third data metal layers 141, 142 and 143 are sequentially formed on the base substrate 100 on which the active pattern AP is formed, and then the first, second and third data metal layers 141, 142 and 143 are patterned to form a preliminary electrode PRE on a formation area of the sacrificial electrode SFE, and the source electrode SE and the drain electrode DE are formed. In a process for forming the preliminary electrode PRE, the source and drain electrodes SE and DE, the first photo pattern 10 including the first thickness portion 11 and the second thickness portion 12 smaller than the first thickness portion 11 is used as an etch stop layer. The preliminary electrode PRE is formed below the first thickness portion 11, and the source and drain electrodes SE and DE are formed below the second thickness portion 12.

Then, the second thickness portion 12 and the third data metal layer 143 of the preliminarily electrode PRE are removed.

Referring to FIG. 18B, the third data metal layer 143 of the preliminary electrode PRE is removed to form the sacrificial electrode SFE. The second insulation layer 150 is formed on the base substrate 100 on which the sacrificial electrode SFE is formed.

Referring to FIGS. 17 and 18B, a second photo pattern (not shown) is formed on the second insulation layer 150, and the first and second insulation layers 120 and 150 are respectively patterned by using the second photo pattern to form the opening portion CTP and the contact hole CTH.

Then, the pixel electrode PE and the first gate contact electrode RCT1 are formed to form the display substrate 605 shown in FIG. 17.

According to the above exemplary embodiment, the sacrificial electrode SFE is formed in a process for forming the source and drain electrodes SE and DE, and the sacrificial electrode SFE is connected to the first gate pad electrode GPE1 formed from a metal layer different from the source and drain electrodes SE and DE, so that the sacrificial electrode SFE may be formed without an additional process for forming the sacrificial electrode SFE. Moreover, a metal layer, which has a standard reduction potential different from that of the sacrificial electrode SFE, is connected to the sacrificial electrode SFE, so that a corrosion of the gate pad part 201 may be reduced or effectively prevented.

In FIGS. 17, 18A and 18B, the first gate pad electrode GPE1 is connected to the sacrificial electrode SFE. Alternatively, when the driving pad part 400 or a pad electrode of the data pad part 500 shown in FIGS. 1 and 2 is formed from a same metal layer as the gate electrode GE, a further sacrificial electrode formed from a same metal layer as the source and drain electrodes SE and DE is connected to the pad electrode, so that a corrosion of the driving pad part 400 or the data pad part 500 may be reduced or effectively prevented.

As described above in detail, according to the invention, a sacrificial electrode is electrically connected to at least one of pad electrodes of a driving pad part, a data pad part and a gate pad part, through a contact electrode, so that electrons generated at a portion on which the sacrificial electrode is exposed to an external side of a display substrate may be easily moved to the pad electrode. Thus, movement of the electrons from the sacrificial electrode to the pad electrode may reduce or effectively prevent the pad electrode from being corroded, so that reliability of a display substrate may be enhanced.

The foregoing is illustrative of the invention and is not to be construed as limiting thereof. Although a few exemplary embodiments of the invention have been described, those skilled in the art will readily appreciate that many modifications are possible in the exemplary embodiments without materially departing from the novel teachings and advantages of the invention. Accordingly, all such modifications are intended to be included within the scope of the invention as defined in the claims. In the claims, means-plus-function clauses are intended to cover the structures described herein as performing the recited function and not only structural equivalents but also equivalent structures. Therefore, it is to be understood that the foregoing is illustrative of the invention and is not to be construed as limited to the specific exemplary embodiments disclosed, and that modifications to the disclosed exemplary embodiments, as well as other exemplary embodiments, are intended to be included within the scope of the appended claims. The invention is defined by the following claims, with equivalents of the claims to be included therein.

What is claimed is:

1. A display substrate comprising:
a substrate comprising a display area and a peripheral area;
a pixel part on the display area, the pixel part comprising a switching element, and a pixel electrode electrically connected to the switching element;
a pad part on the peripheral area and contacting a terminal of an external device, the pad part comprising:
a pad electrode and a contact electrode,
the pad electrode comprising a first metal layer, and a second metal layer on the first metal layer,
the contact electrode contacting the second metal layer; and
a sacrificial electrode on the peripheral area, spaced apart from the pad electrode of the pad part, and comprising an exposed portion including:
a first portion contacting the contact electrode, and
a second portion exposed to an external side of the display substrate.

2. The display substrate of claim 1, wherein the contact electrode includes a same material as the pixel electrode.

3. The display substrate of claim 1, wherein a standard reduction potential of the sacrificial electrode is lower than a standard reduction potential of the contact electrode.

4. The display substrate of claim 1, wherein the exposed portion of the sacrificial electrode includes a first metal layer which is in a same layer as the first metal layer of the pad electrode and contacts the contact electrode.

5. The display substrate of claim 4, wherein
the first metal layers include aluminum (Al),
the second metal layer includes molybdenum (Mo), and
the contact electrode includes a same material as the pixel electrode.

6. The display substrate of claim 5, wherein the contact electrode includes indium (In).

7. The display substrate of claim 4, wherein
the first metal layers include titanium (Ti),
the second metal layer includes copper (Cu), and
the contact electrode includes indium (In).

8. The display substrate of claim 1,
wherein the exposed portion of the sacrificial electrode includes a third metal layer different from the first and second metal layers, the third metal layer contacting the contact electrode, and
further comprising a first signal line, and a second signal line crossing the first signal line on the display area, the second signal line extended from the pad electrode on the peripheral area and including the third metal layer.

9. The display substrate of claim 8, wherein
the first metal layer includes titanium (Ti),
the second metal layer includes copper (Cu), and
the third metal layer includes aluminum (Al).

10. The display substrate of claim 1, further comprising:
the pad electrode and the sacrificial electrode on a substrate, and
an insulation layer on the substrate and including an opening portion partially exposing the sacrificial electrode,
wherein the contact electrode contacts the sacrificial electrode through the opening portion, and the exposed portion of the sacrificial electrode is exposed through the opening portion of the insulation layer.

11. The display substrate of claim 1,
further comprising a signal line connected to a gate electrode of the switching element on the display area,
wherein the pad electrode on the peripheral area is extended from a first terminal of the signal line.

12. The display substrate of claim 1,
further comprising a signal line connected to a source electrode of the switching element on the display area,
wherein the pad electrode on the peripheral area is extended from a first terminal of the signal line.

13. The display substrate of claim 1, further comprising:
a gate drive circuit on the peripheral area, adjacent to first terminals of signal lines on the display area, wherein the gate drive circuit sequentially outputs a plurality of gate signals.

14. The display substrate of claim 13,
further comprising a driving line delivering a control signal to the gate drive circuit,
wherein the pad electrode on the peripheral area is extended from a first terminal of the driving line.

15. The display substrate of claim 14, wherein the driving line is a clock signal line delivering a clock signal to the gate drive circuit.

* * * * *